United States Patent
Lang et al.

(10) Patent No.: US 9,536,702 B2
(45) Date of Patent: Jan. 3, 2017

(54) MULTI-BEAM PARTICLE MICROSCOPE AND METHOD FOR OPERATING SAME

(71) Applicant: Carl Zeiss Microscopy GmbH, Jena (DE)

(72) Inventors: Uwe Lang, Oberkochen (DE); Christian Crueger, Gerstetten (DE); Nico Kaemmer, Koenigsbronn (DE); Christof Riedesel, Essingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/724,541

(22) Filed: May 28, 2015

(65) Prior Publication Data
US 2015/0348749 A1    Dec. 3, 2015

(30) Foreign Application Priority Data

May 30, 2014    (DE) ......................... 10 2014 008 105

(51) Int. Cl.
*H01J 37/26*    (2006.01)
*H01J 37/00*    (2006.01)
(Continued)

(52) U.S. Cl.
CPC ............ *H01J 37/261* (2013.01); *H01J 37/222* (2013.01); *H01J 37/244* (2013.01); *H01J 37/28* (2013.01);
(Continued)

(58) Field of Classification Search
USPC .......................................... 250/306, 307, 311
See application file for complete search history.

(56) References Cited

U.S. PATENT DOCUMENTS

| 5,892,224 A | 4/1999 | Nakasuji |
| 2004/0188636 A1 | 9/2004 | Hosoda et al. |

(Continued)

FOREIGN PATENT DOCUMENTS

| DE | 10 2013 014 976 | 3/2015 |
| DE | 10 2013 016 113 | 3/2015 |

(Continued)

OTHER PUBLICATIONS

German Office Action, with translation thereof, for corresponding DE Appl No. 10 2014 008 105.2, dated Mar. 18, 2015.
(Continued)

*Primary Examiner* — Nicole Ippolito
*Assistant Examiner* — Hanway Chang
(74) *Attorney, Agent, or Firm* — Fish & Richardson P.C.

(57) ABSTRACT

A multi-beam particle microscope includes first particle optics in order to direct particle beams onto an object, a detector with detection regions, with a transducer being assigned to each detection region, and a data acquisition system, which has a control computer system, image recording computer systems and a screen. The image recording computer systems receive electrical signals from the transducers and generates a first file, which represents a high resolution image, and a second file, which represents a low resolution image. The control computer system maintains a data structure which represents an assignment of transducers to two-dimensional spatial vectors and depicts the images on the screen, wherein a reference point in each image is arranged on the screen in a coordinate system of the screen at a location which is defined by a sum of a leading vector, which is the same for all images, and the spatial vector.

20 Claims, 4 Drawing Sheets

(51) Int. Cl.
*H01J 37/22* (2006.01)
*H01J 37/28* (2006.01)
*H01J 37/244* (2006.01)

(52) U.S. Cl.
CPC ... *H01J 2237/0453* (2013.01); *H01J 2237/063* (2013.01); *H01J 2237/1205* (2013.01); *H01J 2237/22* (2013.01); *H01J 2237/221* (2013.01); *H01J 2237/226* (2013.01); *H01J 2237/2443* (2013.01); *H01J 2237/2447* (2013.01); *H01J 2237/2448* (2013.01); *H01J 2237/2806* (2013.01)

(56) References Cited

U.S. PATENT DOCUMENTS

| | | |
|---|---|---|
| 2006/0289804 A1 | 12/2006 | Knippelmeyer et al. |
| 2007/0228274 A1 | 10/2007 | Elyasaf et al. |
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2009/0261267 A1 | 10/2009 | Wieland et al. |
| 2010/0178602 A1 | 7/2010 | Seto et al. |
| 2010/0320382 A1 | 12/2010 | Almogy et al. |
| 2012/0104250 A1 | 5/2012 | Bean et al. |
| 2012/0273690 A1 | 11/2012 | Wieland et al. |
| 2012/0305798 A1 | 12/2012 | Zonnevylle et al. |
| 2013/0032729 A1 | 2/2013 | Knippelmeyer |
| 2013/0187046 A1 | 7/2013 | Zeidler et al. |
| 2014/0070099 A1 | 3/2014 | Aliman et al. |
| 2014/0197322 A1 | 7/2014 | Eder et al. |
| 2014/0224985 A1 | 8/2014 | Rodgers et al. |
| 2015/0069235 A1 | 3/2015 | Kemen et al. |
| 2015/0083911 A1 | 3/2015 | Zeidler et al. |
| 2015/0090879 A1 | 4/2015 | Zeidler et al. |
| 2015/0348738 A1 | 12/2015 | Zeidler et al. |
| 2015/0357157 A1 | 12/2015 | Mueller et al. |

FOREIGN PATENT DOCUMENTS

| | | |
|---|---|---|
| DE | 10 2014 008 083 A1 | 12/2015 |
| DE | 10 2014 008 383 A1 | 12/2015 |
| WO | WO 2005/024881 | 3/2005 |
| WO | WO 2007/028595 | 3/2007 |
| WO | WO 2007/028596 | 3/2007 |
| WO | WO 2007/060017 | 5/2007 |
| WO | WO 2008/101714 A2 | 8/2008 |
| WO | WO 2011/124352 A1 | 10/2011 |
| WO | WO 2012/041464 A1 | 4/2012 |
| WO | WO 2012/112894 A2 | 8/2012 |
| WO | WO 2012/151288 A1 | 11/2012 |
| WO | WO 2013/032949 A1 | 3/2013 |
| WO | WO 2015/043769 A1 | 4/2015 |

OTHER PUBLICATIONS

Zeiss, "Sigma Series: Your FE-SEM for Nanoscale Analytics", 2012, pp. 1-18 (http://www.optecgroup.com/upload/iblock/480/Sigma_FE_SEM.pdf).

S.E. Kapl et al., "Characterization of CMOS programmable multi beam blanking arrays as used for programmable multi-beam projection lithography and resistless nanopattering", Journal of Micromechanics and Microengineering, vol. 21, 2011, pp. 1-8.

MULTI-BEAM PARTICLE MICROSCOPE AND METHOD FOR OPERATING SAME

CROSS-REFERENCE TO RELATED APPLICATIONS

This application claims benefit under 35 U.S.C. §119 to German Application No. 10 2014 008 105.2, filed May 30, 2014, the entire contents of which are incorporated by reference herein.

The invention relates to multi-beam particle microscopes and methods for operating multi-beam particle microscopes.

Individual-beam particle microscopes have been known for a long time. In these, a single focussed particle beam is directed via particle optics onto an object to be examined and scanned over the latter. The particle beam can be an ion beam or an electron beam. Particles liberated from the object by the particle beam, such as e.g. electrons, are detected and the detected particle intensity is assigned to the locations of the object on which the scanning particle beam is currently directed. Thus, it is possible to generate a particle-optical image of the object. Scanning of a field of view of a particle microscope with the particle beam requires time. The extent of the field of view is limited. If relatively large parts of the object are intended to be scanned, the object must be moved relative to the particle microscope in order to scan further fields of view. This in turn requires time. There is a need for the provision of particle microscopes which are able to scan many objects and relatively large objects in a shorter period of time. It is conceivable to provide a larger number of individual-beam particle microscopes for such problems, which microscopes work in parallel in order to be able to scan a plurality of objects simultaneously. However, this is a very expensive solution since a dedicated particle microscope with particle optics must be provided for each individual particle beam.

Here, multi-beam particle microscopes form a promising approach since these plurality of particle beams are guided together through a single particle optics arrangement in order to simultaneously scan the object to be examined with a bundle of particle beams. Although the particle optics of a multi-beam particle microscope are substantially more complicated than those of an individual-beam particle microscope, the increase in the throughput to be expected can however justify this outlay, especially since suitable particle optics and detection systems are already available.

However, new challenges consist in processing the detection signals and large amounts of data generated in a multi-beam particle microscope, controlling the microscope and providing strategies for planning microscopic examinations.

Accordingly, it is an object of the present invention to provide a multi-beam particle microscope which is able to process the large amounts of data generated and, in particular, which is controllable by a user. Furthermore, it is an object of the present invention to propose a method for operating a multi-beam particle microscope, via which a region of interest of an object can be scanned efficiently.

In accordance with embodiments of the invention, a multi-beam particle microscope is provided, which comprises a multi-beam source configured to generate a first field of a plurality of first particle beams. The multi-beam particle microscope can have first particle optics, which are configured to direct the first particle beams onto an object in such a way that the first particle beams are incident at locations of incidence on the object, which form a second field.

Furthermore, the multi-beam particle microscope can have a detector which has a plurality of detection regions, wherein the detection regions are arranged in a third field. Alternatively, the multi-beam particle microscope can have a plurality of detectors which each have one detection region.

The multi-beam particle microscope can furthermore have second particle optics, which are configured to direct second particle beams, emanating from the locations of incidence in the second field from locations of incidence at the object, to the detection regions in such a way that each one of the second particle beams is incident on at least one of the detection regions and second particle beams that differ from one another are incident on detection regions that differ from one another.

The detector or the plurality of detectors can comprise a plurality of transducers, wherein a transducer is assigned to each detection region. The transducer is configured to generate an electrical signal representing a particle intensity incident on the detection region.

The multi-beam particle microscope can have a data acquisition system, which includes a control computer system, one or more image recording computer systems and a screen. The image recording computer system or systems is/are configured to receive the electrical signals from at least one of the transducers and generate a first file from the received electrical signals, which file represents a first particle-microscopic image of a region of the object, which was scanned by one of the plurality of first particle beams, wherein the image represented by the first file is an image with a high image resolution and the first file has a file size that is greater than a first value. The image recording computer system or systems is/are furthermore configured to generate a second file from the received electrical signals, which file represents a second particle-microscopic image of the region of the object, wherein the image represented by the second file is an image with a low image resolution and the second file has a file size that is less than a second value, wherein the second value is less than the first value. Here, the image region, which is represented by the second particle-microscopic image can be identical or virtually identical to the image region which is represented by the first particle-microscopic image, or at least correspond to the latter. The image recording computer system or systems is/are furthermore configured to transmit the second file to the control computer system.

The control computer system is configured to receive the plurality of second images from the one or more image recording computer systems and maintain a data structure which represents an assignment of transducers to two-dimensional spatial vectors. The control computer system is furthermore configured to display the images received from the transducers on the screen, wherein a reference point in each image on the screen is arranged, in a coordinate system of the screen, at a location which is definable by a sum of a leading vector, which is the same for all images, and the spatial vector, which is assigned to the transducer from which the image recording computer system has received the electrical signals in order to generate the image.

In one exemplary embodiment, provision can furthermore be made for a data storage means, and the image recording computer system or systems can be configured to transmit the first file to the data storage means.

In one exemplary embodiment, the multi-beam source can contain a single particle source which generates a particle beam which is subsequently split into the first field of a plurality of particle beams.

In one alternative exemplary embodiment thereto, the multi-beam particle microscope can also have a plurality of particle sources, each of which generates a particle beam, wherein each particle beam generated by a single particle source directly forms one of the plurality of first particle beams.

Furthermore, mixed forms of these two alternative embodiments can also be implemented by virtue of a plurality of particle sources being provided, each of which generates multiple particle beams which, in turn, are subsequently respectively split into a plurality of particle beams such that the split particle beams of the plurality of particle sources together form the first field of a plurality of particle beams.

In accordance with one exemplary embodiment, the first particle optics can have one or more lenses, which are respectively penetrated by all particle beams of the first field of particle beams.

In accordance with a further exemplary embodiment, the first particle optics have lenses, which are respectively penetrated only by one of the particle beams of the first field of particle beams or a subset of the particle beams of the first field of particle beams. In so doing, the second particle optics can have a comparatively simple design since they only need to be embodied so as to prevent second particle beams emanating from different locations of incidence from being incident on the same detection region.

In accordance with exemplary embodiments, the first particle beams are electron beams. However, the first particle beams can also be ion beams.

In accordance with exemplary embodiments, the second particle beams are electron beams. In accordance with alternative embodiments, the second particle beams are photon beams.

The detection regions of the detector can be detection regions of electron detectors which convert incident electrons directly into electrical signals. Examples for such detectors and associated transducers are semiconductor detectors. The detection regions can also be formed by scintillating material, which converts incident electrons into light signals which are subsequently detected by light detectors which finally generate the electrical signals which represent the particle intensity that is incident on the respective detection region. Here, it is possible that optical waveguides are directly coupled to the scintillating material, which optical waveguides guide the generated light to the detectors which convert the light into electrical signals. It is furthermore possible for imaging intermediate optics to be provided between the scintillating material and the detectors which convert the light into electrical signals; these intermediate optics provide an increased flexibility. The detection regions which are assigned to a particle beam can be regions that are fixed at the detector. This can be the case, in particular, in the embodiment of the detector with semiconductor detectors directly detecting the electrons. However, the detection regions assigned to a particle beam may also vary in time, which is possible, in particular, if optics are provided between a scintillator material and the detectors converting the light into electrical signals, which optics can include varying deflection mirrors or other deflection elements, such as electrostatic deflectors or the like. The electrical signals generated by the transducers must be processed. In particular, these signals can be converted into image signals in which an intensity of the electrical signal, which in turn represents a detected particle intensity, is converted into greyscale values of pixels of the image. The individual particle beams are scanned over the object to be examined such that greyscale values are respectively generated for a multiplicity of different locations at the object, which greyscale values can be stitched together to form an image represented by digital data. Here, each image is represented by a block of data which is usually referred to as a file.

Since the particle optics are intended to provide the largest possible resolution of the particle microscope and the number of first particle beams can be large, a lot of image information is generated by the multi-beam particle microscope and contained in the image. Correspondingly, the file representing the image is a very large file. The options for compressing these generated files in respect of their size are limited since the possibly applied compression technology should operate on a largely lossless basis so that, where possible, the complete image information is maintained for the subsequent analysis of the images. However, if a high throughput is desired, it may be desirable to set the image quality to be just so high that it is just sufficiently good for the subsequent analysis. In such cases, the images have a relatively low signal-to-noise ratio, which is why they can hardly be compressed in a lossless manner as a result of the high noise component. Nevertheless, these first generated files, which represent the images with a high image resolution, are very large and stored in the image storage system. In particular, it is possible that these files are not used for controlling the microscope itself, i.e. these images are not analysed in real time as a whole by the control computer in order to monitor the current success of the data recording and, where necessary, undertake changes of settings of the microscope.

However, the image recording computer systems also generate the second files, which provide a lower image resolution and have a file size that is better suited to processing in real time. These second files are transmitted to the control computer system. The latter processes the second files in real time and links them together in accordance with the content of the data structure. In particular, the images represented by the second files are displayed together on a screen, wherein the positions of the individual images are predetermined by the data structure which represents the assignment of transducers to two-dimensional spatial vectors.

In accordance with exemplary embodiments, it is also possible for the control computer system to carry out a task like the image recording computer systems undertake such that the control computer system also receives the electrical signals from one or more transducers and generates large and small image files therefrom.

In accordance with embodiments, the invention provides a method for operating a multi-beam particle microscope, the field of view of which is smaller than a region of interest of an object to be examined, the method comprising the following steps: providing an overview image of an object and a region of interest of the object contained in the overview image; arranging the object to be examined at a sample holder of the multi-beam particle microscope; determining a coordinate transformation, which transforms coordinates of the overview image into coordinates of the sample holder; calculating a tessellation of the region of interest with area pieces, which, in respect of their form and size, correspond to a field of view of the multi-beam particle microscope such that the region of interest is covered without gaps and substantially without overlap by way of the area pieces; repeatedly performing the following measures: positioning the sample stage relative to the multi-beam particle microscope in such a way that the field of view of the multi-beam particle microscope corresponds to one of the area pieces, and recording and storing a particle-microscopic image of the area piece, to be precise for all area pieces of the tessellation; and stitching the stored particle-microscopic images such that the stitched image represents a particle-microscopic image of at least the whole region of interest.

This method can be applied in the relatively new field of correlative microscopy, in which a plurality of alternative microscopic examination processes are used in order to obtain image information of different types and of different qualities and provide added value from the correlation.

By way of example, the overview image can be obtained by light microscopy. Light microscopes usually provide a lower spatial resolution than particle microscopes. However, it is possible to record larger fields of view with light microscopes than particle microscopes. The overview image is used to identify a region of interest at the object, which is intended subsequently to be examined by the multi-beam particle microscope. Here, the assumption is made that this region of interest of the object nevertheless is larger than the field of view of the multi-beam particle microscope. This means that it is not possible to scan the whole region of interest of the object with the multi-beam particle microscope without displacing the object relative to the microscope. Such a displacement needs to be planned and carried out efficiently.

By way of example, the coordinate transformation can be determined by virtue of markings at the object, which are visible in the overview image or contained in the metadata thereof, being examined by the particle microscope in the coordinate system thereof and the corresponding coordinate transformation being determined on the basis thereof. As a result of this, the coordinates of the region of interest are known in the coordinate system of the particle microscope.

The field of view of the particle microscope corresponds to area pieces within the overview image. The tessellation is calculated in such a way that the region of interest is covered without gaps and substantially without overlap by way of the area pieces. Substantially without overlap in this case means that area pieces lying next to one another do not overlap or only overlap to such a small extent that only a small part of each area piece overlaps with another area piece, and so, although the whole region of interest is covered by area pieces and it is possible to obtain corresponding images with the area pieces, the overlap and corresponding data redundancy is low in view of the efficiency. However, a small amount of overlap can be expedient so as to be able to check that images adjacent to one another are aligned correctly with respect to one another and that no unwanted offset is generated involuntarily. To this end, it is possible to check whether the image information contained in the overlapping area pieces is the same. Within the meaning of this, there is a small amount of overlap if, for example, less than 10% or less than 5% of the area of an area piece overlaps with other area pieces.

In accordance with embodiments, the area pieces used for the tessellation all have the same form. This is the form of the field of view of the multi-beam particle microscope.

In accordance with further embodiments, the invention provides a multi-beam particle microscope which has a field of view, the form of which is that of an area piece, which is stitched together from rectangles of the same size, wherein the rectangles are arranged in the area piece line-by-line in such a way that centre points of the rectangles within the lines are arranged along first straight lines parallel to one another.

The area piece can have at least one group made of more than three, more particularly more than four adjacently arranged lines, in which the number of rectangles per line differs by one between mutually adjacent lines.

In accordance with further exemplary embodiments, the area piece has an upper edge, which is defined by an upper edge of a top line of rectangles, wherein the top line contains a minimum number of rectangles, wherein at least three directly adjacent further lines are adjacent to the top line, which further lines respectively contain a number of rectangles which increases from line to line until at least a central line of the area piece contains a maximum number of rectangles, and wherein at least three directly adjacent further lines are adjacent to the at least one central line, which further lines respectively contain a number of rectangles which decreases from line to line until a bottom line of the area piece contains the minimum number of rectangles.

This area piece is suitable for substantially overlap-free tessellation of an area, even though it does not have a trivial rectangular form.

In accordance with further embodiments, a first, a second, a third and a fourth line are arranged directly next to one another in this sequence in the abovementioned group, wherein the following applies to the centre points of a plurality of rectangles of the first line: they are arranged in each case together with a centre point of a rectangle from the third line on second straight lines, which extend orthogonal to the first straight lines; wherein the following applies to the centre points of a plurality of rectangles of the second line: they are arranged in each case together with a centre point of a rectangle from the fourth line on third straight lines, which extend orthogonal to the first straight lines; and wherein the following applies to a plurality of the second straight lines: they are respectively arranged centrally between two directly adjacent third straight lines.

Each part of the area piece, which corresponds to one of the rectangles, can be scanned by a single beam of the multi-beam particle microscope when recording the particle-microscopic image of the area piece, which is why the aforementioned form of the field of view is particularly suitable for the use in multi-beam particle microscopes since relatively large regions of an object can be scanned efficiently due to the possibility of using the field of view for tessellation of areas. In particular, it can be advantageous if the number of rectangles in the area piece, and therefore the number of particle beams used for scanning, is $3n(n-1)+1$.

Embodiments of the invention will be explained below in more detail on the basis of figures. In detail.

Figure 1:
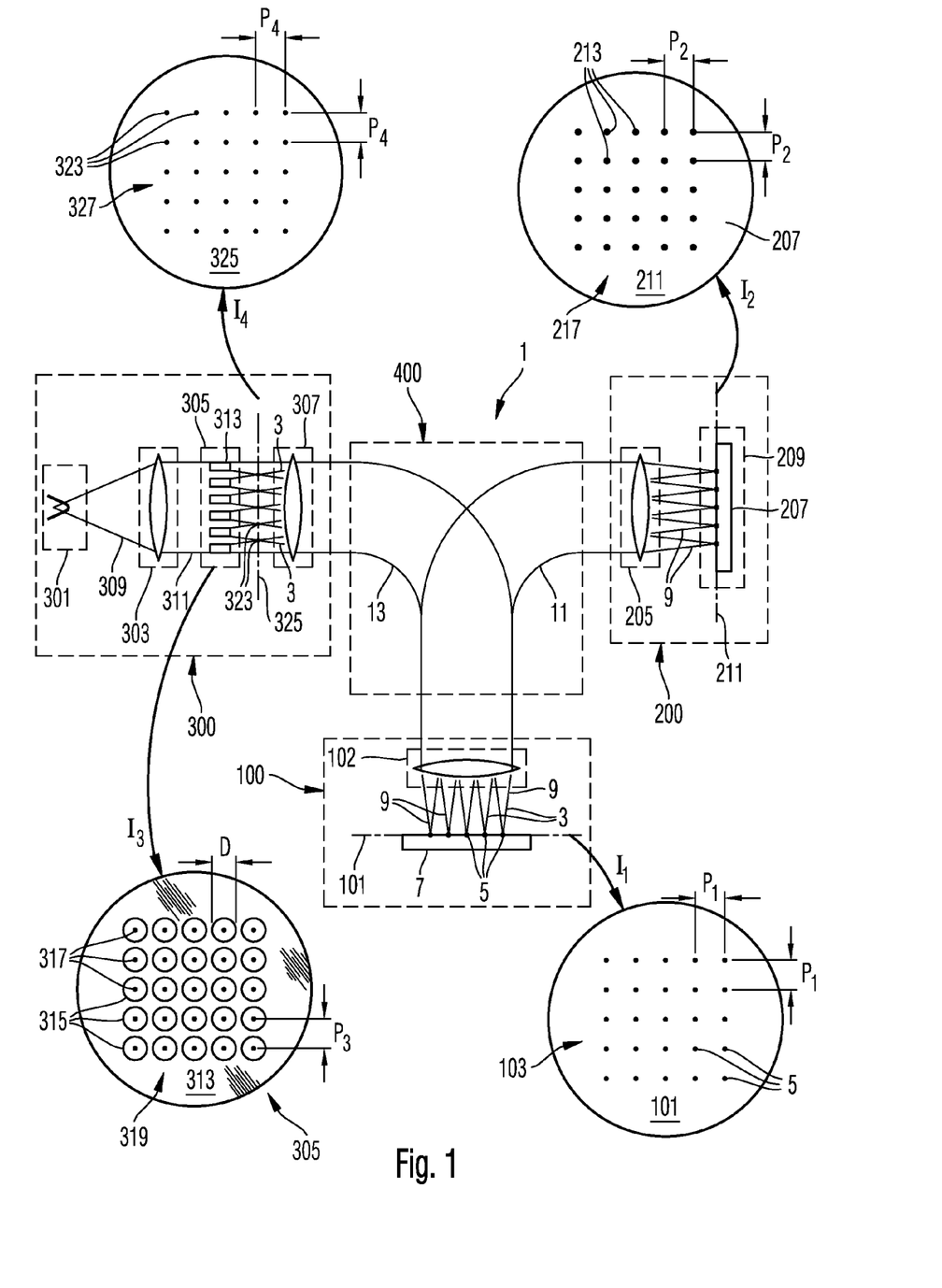
FIG. 1 shows a schematic illustration of a multi-beam particle microscope.

FIG. 1 is a schematic illustration of a multi-beam particle microscope. The particle microscope generates a plurality of beams of charged particles, which are incident on an object to be examined in order to cause electrons there which emanate from the object and are subsequently detected. The particle microscope 1 is a scanning electron microscope (SEM) type microscope, which uses a multiplicity of primary electron beams 3 in order to generate a multiplicity of electron beam spots 5 on a surface of the object 7. The object to be examined 7 can be any type of object and for example comprise a semiconductor wafer, a biological specimen and an arrangement of miniaturized elements or the like. The surface of the object 7 is arranged in an object plane 101 of an objective lens 102 of an objective lens system 100.

The magnified section I1 of FIG. 1 shows a top view of the object plane 101 with a regular rectangular field 103 of beam spots 5, which are formed in the plane 101. In FIG. 1, there is a total of 25 beam spots, which are arranged as a 5×5 field 103. A total of 25 beam spots is a small number, selected for reasons of a simplified illustration. In practice, the total of beam spots can be selected to be substantially greater, such as e.g. 20×30, 100×100 and the like.

In the depicted embodiment, the field 103 of beam spots 5 is a substantially regular rectangular field with a constant spacing p1 between adjacent beam spots. Exemplary values of the spacing p1 are 1 μm, 10 μm and 40 μm. However, it is also possible for the field 103 to have other symmetries, such as e.g. a hexagonal symmetry.

A diameter of the beam spots formed in the object plane 101 can be small. Exemplary values of this diameter are 1 nm, 5 nm, 100 nm and 200 nm. Focusing of the particle beams 3 for forming the beam spots 5 is implemented by the objective lens system 100.

The particles incident on the object cause electrons, which emanate from the surface of the object 7. The electrons emanating from the surface of the object 7 are shaped to electron beams 9 by the objective lens 102. The multiple particle beam system 1 provides an electron beam path 11 in order to feed the multiplicity of electron beams 9 to a detection system 200. The detection system 200 comprises electron optics with a projection lens arrangement 205 in order to direct the electron beams 9 to a detector 209. The detector 209 comprises a scintillator plate 207, which comprises a scintillator material which emits light when electrons are incident on the scintillator material. This light is detected, as will still be explained in detail below.

The section $I_2$ in FIG. 1 shows a plan view of the surface of the scintillator plate 207, on which the electron beams 9 are incident at locations 213. The locations of incidence 213 form a second field 217 arranged with a regular spacing p2 from one another. Exemplary values of the spacing p2 are 10 μm, 100 μm and 200 μm.

The primary electron beams 3 are generated in a multi-beam source 300, which comprises at least one electron source 301, at least one collimation lens 303, a multi-aperture arrangement 305 and a field lens 307. The electron source 301 generates a diverging electron beam 309, which is collimated by the collimation lens 303 in order to form a beam 311 which illuminates the multi-aperture arrangement 305.

The section I3 in FIG. 1 shows a plan view of the multi-aperture arrangement 305. The multi-aperture arrangement 305 comprises a multi-aperture plate 313, which has a multiplicity of openings or apertures 315 formed therein. Centre points 317 of the openings 315 are arranged in a pattern 319 which corresponds to the pattern 103 formed by the beam spots 5 in the object plane 101. A spacing p3 between the centre points 317 of the apertures 315 can have exemplary values of 5 μm, 100 μm and 200 μm. The diameters D of the apertures 315 are smaller than the spacing p3 of the centre points of the apertures. Exemplary values of the diameters D are 0.2×p3, 0.4×p3 and 0.8×p3.

Electrons of the illuminating beam 311 pass through the apertures 315 and form electron beams 3. Electrons of the illuminating beam 311, which are incident on the plate 313, are caught by the latter and do not contribute to forming the electron beams 3.

The multi-aperture arrangement 305 focuses the electron beams 3 in such a way that beam foci 323 are formed in a plane 325. The section I4 in FIG. 1 shows a top view of the plane 325 with the foci 323 arranged in a pattern 327. A spacing p4 of the foci 323 in the pattern 327 can be the same as the spacing p3 in the pattern 319 of the multi-aperture plate 313, or differ therefrom. By way of example, a diameter of the foci 323 can be 10 nm, 100 nm and 1 μm.

The field lens 307 and the objective lens 102 provide an imaging system for imaging the plane 325, in which the foci are formed, onto the object plane 101 such that a field 103 of beam spots 5 is formed there on the surface of the object 7.

A beam switch 400 is provided in the beam path between the multi-aperture arrangement 305 and the objective lens system 100. The beam switch 400 is also part of the beam path 11 between the objective lens system 100 and the detection system 200.

Further information in respect of such multi-beam particle beam systems and components used therein, such as e.g. particle sources, multi-aperture plates and lenses, can be obtained from the international patent applications WO 2005/024881, WO 2007/028595, WO 2007/028596 and WO 2007/060017 and the German patent applications with the application numbers DE 10 2013 016 113.4 and DE 10 2013 014 976.2, the disclosures of which are incorporated in their entirety into the present application by reference.

Figure 2:
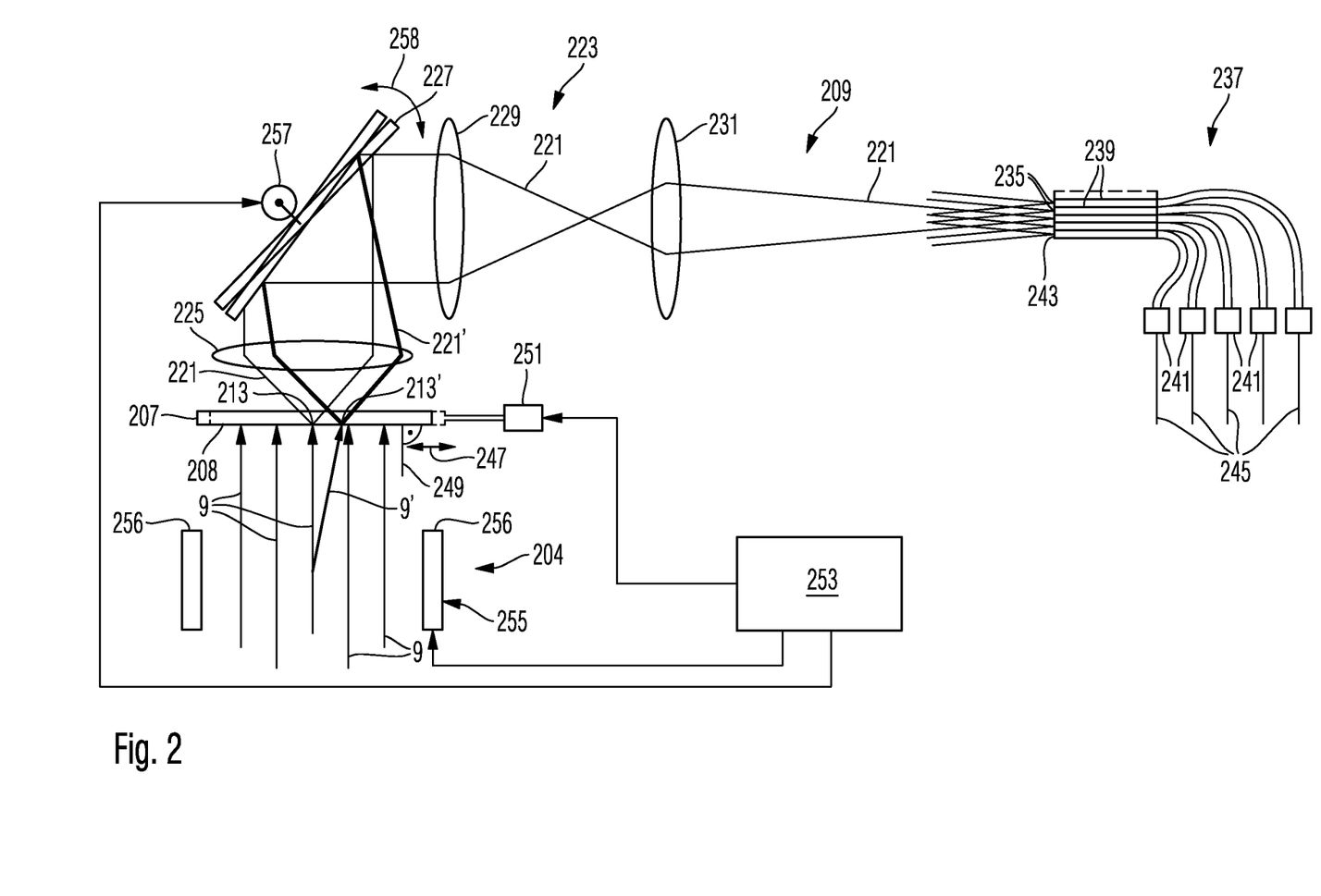
FIG. 2 shows a schematic illustration of a detector, as can be used in the multi-beam particle microscope from FIG. 1.

FIG. 2 is a schematic illustration for clarifying a number of details of the detector 209. The detector 209 comprises the scintillator plate 207, on which the electron beams are directed by electron optics 204. When integrated into the multi-beam particle microscope of FIG. 1, these electron optics 204 comprise the electron-optical components of the particle optics which form the electron beams 9, i.e., for example, the objective lens 102, which guide the electron beams 9 to the detector 209, such as e.g. the beam switch 400, and which focus the electron beams 9 on the surface of the scintillator plate 207, such as e.g. the lens 205. The electron beams 9 are incident at locations of incidence 213 on the scintillator plate 207. Even if the electron beams 9 are focused onto the surface of the scintillator plate 207, beam spots with diameters that are not arbitrarily small are formed on the surface. The centre points of the beam spots can be considered to be the locations of incidence 213, which are arranged spaced apart with the spacing p2 (cf. FIG. 1).

The scintillator plate 207 contains a scintillator material which is excited by the incident electrons of the electron beams 9 to emit light beams. Therefore, each of the locations of incidence 213 therefore forms a source for light beams. FIG. 2 merely depicts one such light beam 221, which emanates from the location of incidence 213 of the middle one of the five depicted electron beams 9. The light beam 221 passes through light optics 223, which comprise a first lens 225, a mirror 227, a second lens 229, a third lens 231 and a beam splitter 233, and is then incident on a light-reception area 235 of a light-detection system 237. The light-reception area 235 is formed by an end face of an optical fibre 239, into which at least some of the light beam 221 is coupled, and directed to a light detector 241. By way of example, the light detector can comprise a photomultiplier, an avalanche photodiode, a photodiode or other types of suitable light detectors. The light optics 223 are configured in such a way that they optically image the surface 208 of the scintillator plate 207 in a region 243 in which the light-reception area 235 is arranged. Optical images of the locations of incidence 213 are generated in the region 243 due to this optical imaging. A separate light-reception area 235 of the light-detection system 237 is provided for each one of the locations of incidence 213 in the region 243. Each one of the further light-reception areas 235 is formed by an end face of an optical waveguide 239, which guides the light coupled-in at the end face to a light detector 241. A light-reception area 235 is assigned to each one of the locations of incidence 213 due to the optical imaging, wherein the light entering a respective light-reception area 235 is detected by a separate light detector 241. The light detectors 241 emit electrical signals via signal lines 245. These electrical signals represent intensities of the particle beams 9. Therefore, the locations on the surface of the scintillator plate, which is imaged on the light-reception area of a light detector 241, define a detection region and the scintillator material in this detection region, the light optics 223, the optical fibre 239, which leads to this light detector, and this light detector define a transducer which generates electrical signals that represent the particle intensity incident on the detection region.

In the exemplary embodiment explained here, the light detectors are arranged at a distance from the light-reception areas onto which the light optics image the scintillator plate and the received light is fed to the light detectors through optical fibres. However, it is also possible for the light detectors to be arranged directly where the light optics generate the image of the scintillator plate, and the light-sensitive areas therefore form the light-reception areas. The light-reception areas are arranged in a third field.

The electron beams 9 extend in a vacuum and the surface 208 of the scintillator plate 207 is also arranged in the vacuum. The light optics 223 can be arranged outside of the vacuum, with a vacuum window then being provided in the beam path of the light beam 221, the vacuum window being penetrated by the beam 221 and separating the vacuum from the surroundings.

The electron beams incident on the scintillator plate 207 can ionize residual gas molecules in the region in front of the scintillator plate, leading to electric charges at the locations of incidence 213 which, in turn, can attract gaseous contaminants that remain in the vacuum, and so the contaminants are deposited at the locations of incidence 213 on the scintillator plate 207 and lead to a deterioration of the properties of the scintillator material such that the intensity of the light beams 221 caused by the incident electron beams 9 decreases with time. This problem can be counteracted by virtue of the locations of incidence 213 being displaced in a direction 247 perpendicular to the surface normal 249 of the scintillator plate, which is oriented orthogonal to a normal 249 in respect of the surface 208 of the scintillator plate 207. As a result, the electron beams 9 are not always incident at the same locations of incidence 213 on the surface 208 of the scintillator plate 207, but are moved over the surface 208 of the scintillator plate 207 and therefore regularly moved to new locations on the surface 208. Contamination that occurred at specific locations on the surface 208 of the scintillator plate 207 then does not impede the generation of light from the incident electron beams 9 at the locations of incidence 213.

There are a number of options for generating the displacement of the locations of incidence 213 relative to the scintillator plate 207. Some of these numerous possibilities are depicted in FIG. 2, with it not being necessary to implement all possibilities depicted in FIG. 2 for displacing the locations of incidence 213 relative to the scintillator plate 207 in practice. By way of example, it is sufficient to implement only a single one of these options.

One of the options for displacing the locations of incidence 213 relative to the scintillator plate 207 consists of displacing the scintillator plate 207 itself in the direction 247 perpendicular to the surface normal 249 of the scintillator plate. To this end, provision is made for an actuator 251, which is coupled to the scintillator plate 207 in order to move the latter in the direction 247 perpendicular to the surface normal 249 of the scintillator plate. FIG. 2 depicts two positions of the scintillator plate 207, to be precise one using solid lines and one using dashed lines. The actuator 251 is controlled by a control unit 253, which actuates the actuator 251 in order to generate a movement of the scintillator plate 207 relative to components of the electron optics 204 in the direction 247. By way of example, this movement can be implemented in a uniform or step-by-step manner. By way of example, the speed of the movement can be 0.01 mm per hour operational time to 0.1 mm per hour operational time or more. The movement can comprise a dimension or a lift, which is greater than 0.1 times the spacing p2 between the locations of incidence 213 of the electron beams 9.

When the scintillator plate 207 is moved relative to the components of the electron optics 204, the position of the locations of incidence 213 relative to the electron optics 204 and relative to the light optics 223 is not modified, and so the light optics 223 continue to image the locations of incidence 213 in the region 243, in which the light-reception areas 235 of the associated light detector 237 are arranged, and so the intensities of the electron beams 9 can be detected continuously by the light detector 237 with unchanged light optics 223.

A further option for bringing about the displacement of the locations of incidence relative to the scintillator plate 207 consists of deflecting the electron beams prior to the incidence thereof on the scintillator plate 207. To this end, the electron optics 204 can comprise a beam deflector 255, which deflects the electron beams 9 together. By way of example, the beam deflector 255 can comprise two electrodes 256, which are arranged on both sides of the bundle of electron beams 9 and to which the control unit 253 applies suitable deflection voltages.

The beam deflector 255 deflects all electron beams 9 together such that the locations of incidence 213 relative to the scintillator plate 207 are displaced. In FIG. 2, the deflection of the central electron beam 9 is depicted by an arrow 9' in an exemplary manner. The deflected electron beam 9' is incident on a displaced location of incidence 213' on the surface 208 of the scintillator plate 207, and a light beam 221', which is displaced in relation to the depicted light beam 221, which emanates from the nondisplaced location of incidence 213 of the central electron beam 9, emanates from the displaced location of incidence 213. However, in the case of unmodified imaging optics 323, the displaced location of incidence 213' is not necessarily imaged on the light-reception area 235 assigned to the central electron beam 9. Therefore, it is necessary to compensate the displacement of the location of incidence 213' relative to the light optics 223. To this end there are, in turn, a number of options.

One option consists of embodying the mirror 227 as a swivel mirror, which is swivelable by an actuator 257, as indicated by an arrow 258. The actuator 257 is controlled by the control unit 253 in such a way that the displaced light beam 221 at the swivel mirror 227 is reflected in such a way that it substantially coincides with the beam path of the nondisplaced light beam 221 and the light emanating from the displaced location of incidence 213' returns to that light-reception area 235 which is assigned to the central electron beam 9. This deflection of the light beam 221' by the swivel mirror 227 is implemented for all light beams emanating from the multiplicity of locations of incidence 213 such that these all are incident on the light-reception areas 235 assigned thereto and so that therefore the intensities of all deflected electron beams 9' can be detected.

Figure 3:
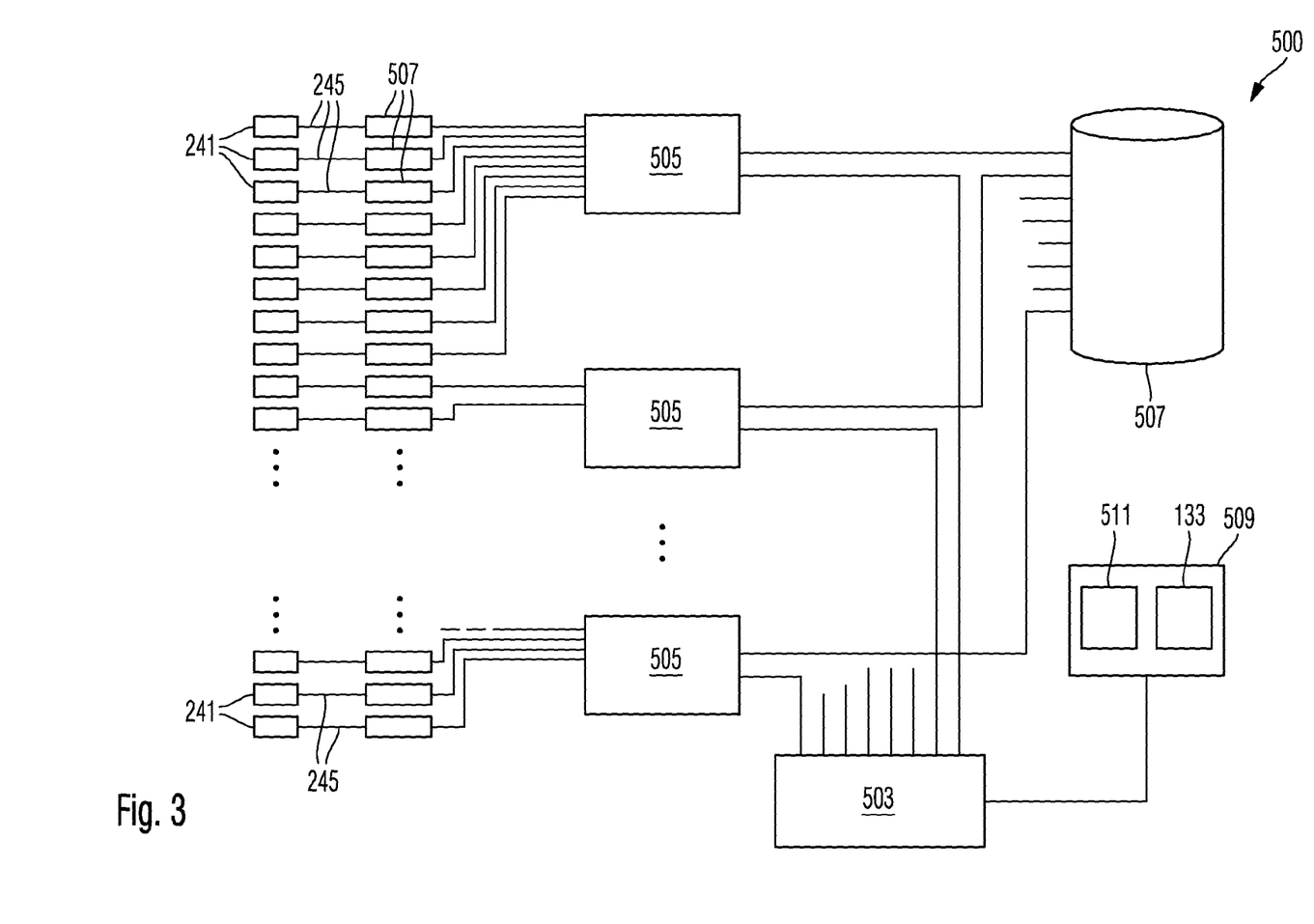
FIG. 3 shows a schematic illustration of a data acquisition system, which can be used together with the detector.

FIG. 3 shows a schematic illustration of a data acquisition system of the multi-beam particle microscope 1. The data acquisition system 500 comprises a control computer system 503 and a plurality of image recording computer systems 505. A plurality of frame grabbers 507 are connected to each image recording computer system 505. Each one of the frame grabbers 507 is connected via one of the signal lines 245 to one of the light detectors 241 in order to receive the electrical signals output thereby. These electrical signals can be analogue signals, which are digitized in the frame grabber. In a manner not depicted in FIG. 3, the frame grabber 507 also obtains information about how far the scanning deflection of the particle beams 3 incident on the object 7 has advanced. By way of example, this information can be fed to the frame grabbers 507 via a clock signal, which is output by the control computer system 503 or a different clock generator and, for example, likewise serves for controlling the scanning deflection of the particle beams 3. The frame grabbers 507 then respectively generate image information by virtue of converting detected particle intensities into greyscale values of an image and assigning these to a location in the image. The image information is two-dimensional and can be stored in a linear data storage means in a column-by-column or line-by-line manner in order subsequently to be addressable. The image information for each one of the detected images is transmitted from the frame grabber 507 to the image recording computer system 505 by virtue of the frame grabber 507 for example writing the image information directly into the main memory of the image recording computer system 505. However, it is also possible that the image recording computer system 505 reads out the image data from the frame grabber 507 and itself writes the image data into its own main memory.

The number of frame grabbers 507 connected to each one of the image recording computer systems 505 is such that the image data generated by the plurality of frame grabbers 507 can be processed by the image recording computer system in real time. In the depicted exemplary embodiment, up to eight frame grabbers 507 are connected to one image recording computer system 505. In the depicted exemplary embodiment, the number of employed particle beams 3 is 61. Correspondingly, provision is made for 61 light detectors 241 and 61 frame grabbers 245. Hence, eight image recording computer systems 505 are necessary, with eight frame grabbers 507 in each case being connected to seven of the image recording computer systems 505 and four frame grabbers 507 being connected to the eighth image recording computer system. It is also possible to use frame grabbers which have a plurality of channels such that a plurality of light detectors are connected to one frame grabber. By way of example, use can be made of four frame grabbers, which each have 16 channels. Some of the channels then remain unused and can serve as a reserve in the case of a defect of one of the frame grabbers.

Each one of the image recording computer systems 505 has a fast main memory, in which the image data generated by the frame grabbers are stored for further processing. This main memory is addressable by one or more processors of the image recording computer system 505 such that the one or more processors of the image recording computer system 505 can access the main memory and process the image data. However, the plurality of image recording computer systems 505 differ in that the fast main memories and processors thereof differ from one another. However, this does not preclude the plurality of image recording computer systems from having peripheral components, such as e.g. electric power supplies and other interfaces, in common or being installed in a common housing or rack.

Each one of the image recording computer systems processes the obtained image data by virtue of an image file being generated therefrom in each case. In addition to the pure image data, the image file also contains metadata which describe the image data. By way of example, these metadata can comprise a time of the image recording or an image number; they can characterize the particle beam used to record the respective image, they can represent a position of the sample stage relative to the particle microscope or represent the position of the recorded image on the object in the coordinate system thereof, they can contain a label of the examined object, provided by a user, and further information. The image information itself can also be compressed by the image recording computer system. Furthermore, the image recording computer system can process the images by virtue of, for example, image noise being smoothed and contrasts being increased or reduced. However, in principle, there is an interest in representing the obtained image data as comprehensively as possible in the image files such that, where possible, the whole image information is contained in the image files and available for the subsequent analysis of the images.

The image recording computer systems store the generated image files in a data storage means 508. The data storage means can be a magnetic hard disk drive storage means, a semiconductor storage means (SSD, Flash) or a storage system connected via a network. Computer systems and software which undertake the subsequent analysis of the images then obtain the image files from the data storage means 508. In the exemplary embodiment explained here, provision is made for a single data storage means 508, in which the image recording computer systems 505 store the generated image data. However, it is also possible for a plurality of such data storage means to be provided, wherein one data storage means is in each case assigned to a group of image recording computer systems or to a single image recording computer system.

In the depicted exemplary embodiment, use is made of 61 particle beams 3. These are scanned over the surface of the object 7, wherein e.g. $1 \times 10^6$ to $100 \times 10^6$ points are scanned per second. In the case of $40 \times 10^6$ points scanned per second, each individual frame grabber generates greyscale values for $40 \times 10^6$ pixels each second. Each greyscale value can be represented by 8 bit. In the case of e.g. 5000×4000 pixels per image, this leads to an amount of data of approximately 20 megabytes per image. In the case of a pixel rate of approximately 40 MHz for each particle beam, recording an image correspondingly takes half a second, and so the eight image recording computer systems for the 61 particle beams correspondingly transfer 2.4 gigabytes per second to the data storage means.

This amount of data is very large and cannot be processed easily in real time. However, it is desirable nevertheless to obtain and process information for obtaining an image in real time. By way of example, a user wishes to obtain a view, generated in real time, of the scanned area for the totality of the particle beams. The control computer system is provided to this end and obtains image files from the image recording computer systems which, due to the reduced amount of data contained therein, are suitable for processing in real time. From the obtained image data for individual images, the image recording computer systems 505 generate image data for reduced images, which have a reduced amount of image information and can therefore be made into smaller files. These smaller files are transmitted from the image recording computer systems 505 to the control computer system 503. The smaller files can be generated by virtue of the fact that the data of individual pixels, such as e.g. every second pixel, is removed from the original image data, that the number of employed greyscale values is reduced and that image compression techniques are employed. It is also possible to reduce the number of pixels of the image by virtue of individual pixels of the generated image being obtained by integration or averaging of a plurality of original pixels. By way of example, 2×2 or 3×3 original pixels can be combined to form a pixel of the generated image of reduced image information or resolution.

These image files with a smaller file size can be processed by the control computer system 503 in real time. It is also possible, for example, to control the multi-beam particle microscope 1 as a function of this processing. By way of example, particle-optical components of the microscope can be set as a function of this image processing.

The control computer system 503 displays the images represented by the small files on a screen 509. The way in which the smaller files are generated by the image recording computer systems 505 can be selected. In particular, the size of the smaller files can be set, for example by virtue of a compression ratio or an allowed data loss from the reduction in the file sizes being set. If the file size is smaller, the display of the same on the screen 509 can be updated more frequently.

The content of the display of the small files on the screen 509 is explained below with reference to FIG. 4.

Figure 4:
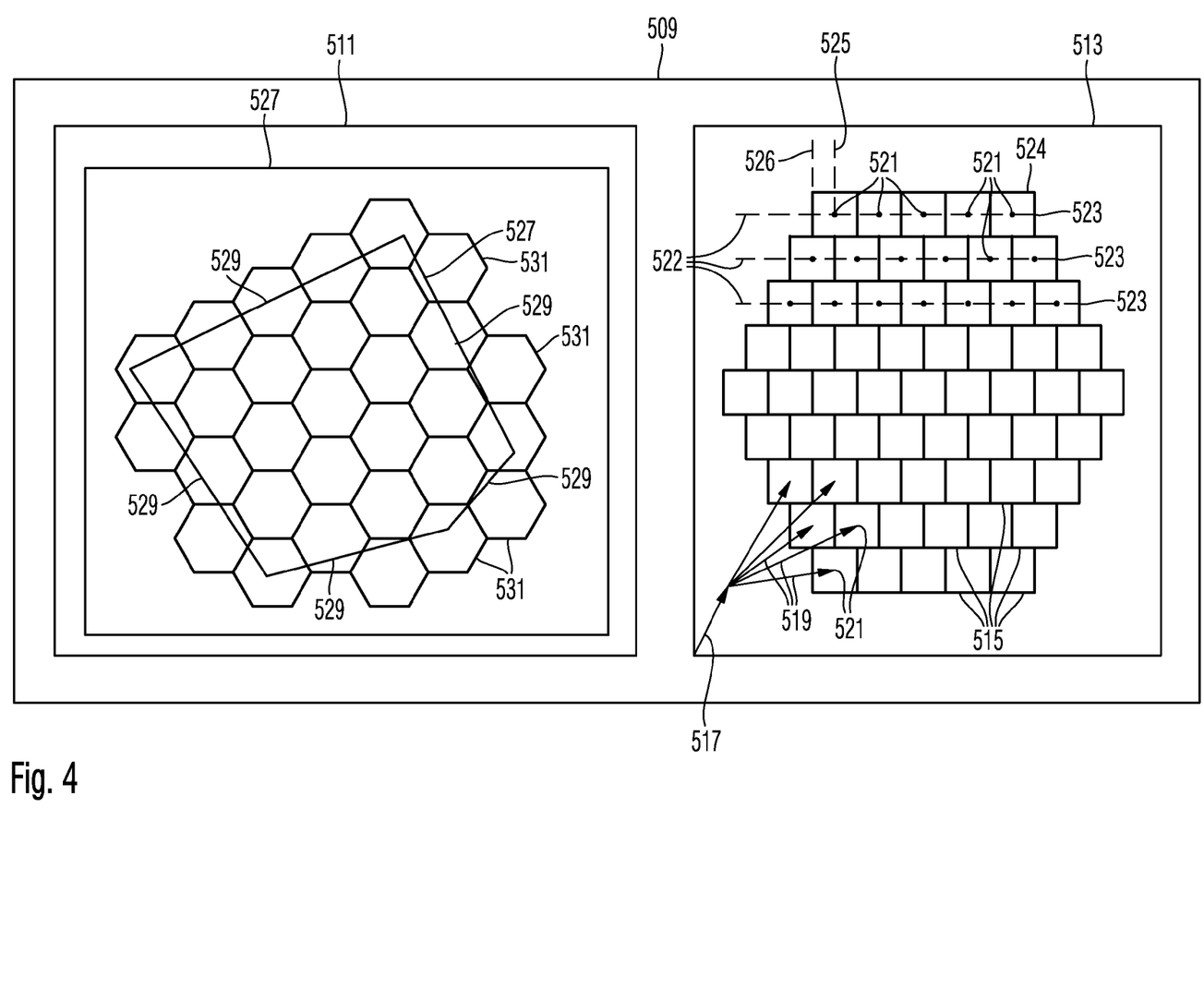
FIG. 4 shows a schematic view of a display on a screen of the data acquisition system from FIG. 3.

FIG. 4 is a schematic view of a display on the screen 509 of the data acquisition system 500. A left-hand image window 511 and a right-hand image window 513 are displayed on the screen 509. In the right-hand image window 513, the images represented by the small files are displayed and stitched together to form an overall image. The individual images respectively have a rectangular form. In the depicted example, the form of the images is square in each case. In FIG. 4, the individual images are denoted by the reference sign 515.

Each one of the images 515 is arranged at a specific position in the window 513. The positions of the images can respectively be described by a leading vector 517, which is the same for all images 515, and a two-dimensional spatial vector 519, which leads from the tip of the leading vector 517 to a reference point 521 in the respective image. In the depicted example, the centre points of the images 515 are the reference points 521 in each case. However, it is also possible for different points to be used as reference points, such as e.g. the left-hand bottom corner of an image 515. Moreover, the reference points need not be the same for all images. In principle, the leading vector 517 can be selected as desired. In the depicted example, it emanates from the left-hand lower corner of the window 513 and leads to a freely selected point within the window.

The spatial vectors 519 are selected in such a way that the individual images 515 are arranged in the pattern depicted in FIG. 4 such that a plurality of lines 523 of images are generated, wherein a top line contains a minimum number of images, a central line contains a maximum number of images and a bottom line in turn contains the minimum number of images. The number of images respectively increases by one or respectively decreases by one from line to line. In the depicted exemplary embodiment, the top, first line contains five images, the second line contains six images, the third line contains seven images, the fourth line contains eight images, the fifth line contains nine images, the sixth line contains eight images, the seventh line contains seven images, the eighth line contains six images and the ninth line contains five images. The images of mutually adjacent lines are offset relative to one another by half a width of the images in the line direction. This can be seen by virtue of the fact that the following applies for a group consisting of a first, a second, a third and a fourth line 523, which are arranged immediately adjacent to one another in this sequence: the centre points 521 of a plurality of rectangles 515 of the first line are arranged in each case together with a centre point of a rectangle from the third line on second straight lines 525, which extend orthogonal to the first straight lines 522, and the centre points of a plurality of rectangles of the second line are arranged in each case together with a centre point of a rectangle from the fourth line on third straight lines 526, which extend orthogonal to the first straight lines 522. In particular, a plurality of the second straight lines are then respectively arranged centrally between two immediately adjacent third straight lines.

In order to achieve this arrangement of images in the window 513, the control computer system 503 maintains a data structure which represents an assignment of frame grabbers 507 to spatial vectors 519. Together with each image file, or from metadata in the image file, the control computer system obtains information about which one of the plurality of frame grabbers 507 has generated the signals from which the image file was generated. With the aid of this information, the control computer system can obtain the leading vector 519 from the data structure, which leading vector is to be used for displaying the image 515 in the window 513 and accordingly displaying each one of the obtained images at a position in the window 513 which is assigned to the respective frame grabber 507. The data structure can be stored in a configuration file of the control computer system. The spatial vectors 519 can be selected as desired such that, for example, a rotated hexagon is generated and/or the spacing between the images can be set in a variable fashion.

Geometrically, the arrangement of the images 515 in the window 513 corresponds to the arrangement of the particle beams 3 directed to the object in the plane of the object. The images 515 in the window 513 together generate an overview image of the region of the object currently scanned by the multi-beam particle microscope. Generating this overview image and the display thereof allow the user to monitor the progress of the examination of the object using the multi-beam particle microscope. In particular, the user can verify by observing the overview image that the multi-beam particle microscope is currently in good working order and possibly arising problems can be identified in good time.

Therefore, a contour of the whole arrangement of the images 515 represents a contour of the field of view of the multi-beam particle microscope. This contour of the field of view is roughly hexagonal, wherein the upper and the lower edge of the field of view are respectively defined by straight lines and the four edges of the field of view extending at an angle in the illustration of FIG. 4 are delimited by lines extending in a step-shaped manner.

The form of the field of view of the multi-beam particle microscope, which is roughly hexagonal and has both straight-line and step-shaped edges, is suitable for tessellation, i.e. coverage of a relatively large area without gaps and without overlap, such that images of a relatively large area can be obtained efficiently by recording a plurality of images in succession. This is subsequently explained on the basis of the left-hand window displayed on the screen 509. The left-hand window 511 shows an overview image 527 of the object to be examined, wherein the overview image 527 was obtained with a microscope that differs from the multi-beam particle microscope. By way of example, the overview image 527 can be generated by a light microscope or have been generated previously by the multi-beam particle microscope in a different imaging or illumination mode.

The content of the overview image 527 is not shown in the illustration of FIG. 4 for reasons of clarity. However, the user can see this content and identify regions of interest therein, which are subsequently intended to be examined by the multi-beam particle microscope. An example for a region of interest is indicated in FIG. 4 using a contour line 529. The contour line 529 is a closed line composed of a plurality of straight lines 529 and defines the edge of the region of interest. The lines 529 are set by the user after analysing the overview image 527 and identifying, in the overview image 527, the objects of interest contained therein, for the purposes of which the control computer system provides a suitable software module which the user can operate with input tools, such as a mouse, which moves a cursor on the screen 509.

After the region of interest is set as an area delimited by the line 529, the control computer system calculates a tessellation of the area 527 using area pieces 531, which in each case correspond to the field of view of the particle microscope. In the overview image 527, these area pieces 531 are depicted as hexagons, which respectively reproduce the rough form of the field of view of the particle microscope, with the delimiting lines of the hexagons extending at an angle to the horizontal being depicted as straight lines in the overview image 527. However, these delimiting lines are in fact stepped lines, as is shown in the illustration of the area piece in the right-hand window 513 of the screen 509. Nevertheless, the stepped angled delimiting line of the area pieces allows the area of the region of interest 527 to be tessellated by the area pieces 531, i.e. be covered without gaps and substantially without overlap. A possible tessellation of the region of interest 527, which is calculated by the control computer system, is depicted with the field of hexagons 531 in the overview image 527. The field of hexagons 531 only contains those hexagons which are required for covering the whole region of interest 527. Hexagons which do not at least partly cover the region of interest 527 are not contained in the field. The area pieces 531 cover the region of interest 527 substantially without overlap. This means that small overlaps are possible and possibly brought about in a targeted manner in order to cover small parts of the region of interest 527 with, in each case, two area pieces 531 such that these slightly overlap at their edge such that it is possible to verify, by analysing the overlapping regions, that the tessellation is carried out correctly. Likewise, the images 523 within the line and between mutually adjacent lines can slightly overlap in order to determine that each one of the particle beams experiences the desired deflections during the scanning process.

The control computer system can display the calculated tessellation in the overview image 527 as hexagons 531 and demand confirmation from the user. After the confirmation is obtained or—if this is not demanded—immediately after calculating the tessellation, the control computer system 503 actuates the multi-beam particle microscope 1 in such a way that a particle-microscopic image of the object is obtained for each one of the area pieces 531. To this end, the sample stage is successively displaced relative to the particle microscope to positions such that the field of view of the particle microscope corresponds to one of the area pieces 531 in the overview image 527 at each one of the positions. A particle-microscopic image of the object is obtained at these positions of the object in each case, as is explained above. After all positions were successively passed over and the corresponding particle-microscopic images were obtained and stored in the data storage means 508, the images can be analysed. Moreover, the control computer system can display the obtained images from the obtained smaller files in the window 511 at the positions corresponding to the area pieces 531 such that the stitched together particle-optical image of the object is also depicted in the overview image 527 in real time.

The data acquisition system explained above on the basis of FIG. 3 has a plurality of image recording computer systems, with a plurality of frame grabbers being connected to each image recording computer system and a light detector being connected to each frame grabber. However, it is also possible for a single frame grabber to be connected to each image recording computer system 505 or for the former to be integrated into the image recording computer system, with a plurality of light detectors being connected to the one frame grabber.

In the exemplary embodiment explained above, 61 particle beams are arranged in a hexagonal pattern in such a way that the field of view has a roughly hexagonal form overall. However, it is also possible to work with other forms of the fields of view. By way of example, use can be made of a rectangular field of view, in which the images are arranged in a plurality of lines, with each line containing the same number of images and, in the illustration of FIG. 4, the left-hand edges of images of successive lines being flush. Furthermore, it is possible to provide an arrangement of the images in a plurality of lines, with the number of images in successive lines being n and n+1 alternately.

In the exemplary embodiments explained above, the plurality of first particle beams are generated and directed to the object field by a single objective lens. However, it is also possible to direct each one of the particle beams to the object through an objective lens assigned to the individual particle beam. The first particle optics of such a multi-beam particle microscope therefore comprise a number of objective lenses corresponding to the number of particle beams. Such multi-beam particle microscopes are referred to as multicolumn/multibeam systems.

The invention claimed is:

1. A multi-beam particle microscope, comprising:
   a multi-beam source configured to generate a first array of a plurality of first particle beams;
   first particle optics configured to direct the first particle beams onto an object so that the first particle beams are incident at locations of incidence on the object, which form a second array;
   a detector comprising a plurality of detection regions or a plurality of detectors which each have one detection region, the detection regions being arranged in a third array, the detector or detectors comprising a plurality of transducers, a transducer being assigned to each detection region and configured to generate an electrical signal representing a particle intensity incident on the detection region; and a data acquisition system comprising a control computer system and at least one image recording computer system, wherein:

i) the at least one image recording computer system is configured to:
a) receive the electrical signals from at least one of the transducers;
b) generate a first file from the received electrical signals, the first file representing a first particle-microscopic image of a region of the object scanned by one of the plurality of first particle beams, the image represented by the first file being an image with a high image resolution, and the first file having a file size that is greater than a first value;
c) generate a second file from the received electrical signals, the second file representing a second particle-microscopic image of the region of the object, the image represented by the second file being an image with a low image resolution, the second file having a file size that is less than a second value, and the second value being less than the first value; and
d) transmit the second file to the control computer system; and ii) the control computer system is configured to:
a) receive the second images from the at least one image recording computer system;
b) maintain a data structure representing an assignment of transducers to two-dimensional spatial vectors; and
c) display the images received from the transducers on a screen, a reference point in each image on the screen being arranged, in a coordinate system of the screen, at a location which is definable by a sum of:
a) a leading vector which is the same for all images; and
b) a spatial vector assigned to the transducer from which the image recording computer system has received the electrical signals in order to generate the image.

2. The multi-beam particle microscope of claim 1, further comprising second particle optics configured to direct second particle beams emanating from the locations of incidence in the second array from locations of incidence at the object to the third array of detection regions so that:

each second particle beam is incident on at least one of the detection regions arranged in the third array; and
second particle beams that differ from one another are incident on detection regions that differ from one another.

3. The multi-beam particle microscope of claim 2, wherein:

the locations of incidence in the second array, in a coordinate system of the object, are respectively defined as a sum of: a leading vector which is the same for all locations of incidence; and a vector; and
each spatial vector in the coordinate system of the screen is a product of: one of the vectors in the coordinate system of the object; and a factor which is the same for all spatial vectors.

4. The multi-beam particle microscope of claim 1, wherein:

the locations of incidence in the second array, in a coordinate system of the object, are respectively defined as a sum of: a leading vector which is the same for all locations of incidence; and a vector; and
each spatial vector in the coordinate system of the screen is a product of: one of the vectors in the coordinate system of the object; and a factor which is the same for all spatial vectors.

5. The multi-beam particle microscope of claim 1, wherein the locations of incidence in the second array are arranged in a hexagonal pattern.

6. A method of operating a multi-beam particle microscope, a field of view of the multi-beam microscope being smaller than a region of interest of an object to be examined, the method comprising:

providing an overview image of an object and a region of interest of the object contained in the overview image;
arranging the object to be examined at a sample holder of the multi-beam particle microscope;
determining a coordinate transformation which transforms coordinates of the overview image into coordinates of the sample holder;
calculating a tessellation of the region of interest with area pieces which, with respect to their form and size, correspond to a field of view of the multi-beam particle microscope such that the region of interest is covered without gaps and substantially without overlap by way of the area pieces;
repeatedly: a) position the sample stage relative to the multi-beam particle microscope so that the field of view of the multi-beam particle microscope corresponds to one of the area pieces; and b) record and store a particle-microscopic image of the area piece for all area pieces of the tessellation; and
stitching the stored particle-microscopic images such that the stitched image represents a particle-microscopic image of at least the whole region of interest.

7. The method of claim 6, wherein each area piece used for the tessellation has the same form.

8. The method of claim 7, wherein the area pieces are stitched together from rectangles having the same size.

9. The method of claim 8, wherein the rectangles are arranged in the area piece line-by-line so that center points of the rectangles within the lines are arranged along first straight lines parallel to one another.

10. The method of claim 9, wherein the area piece has at least one group made of more than three lines in which the number of rectangles per line differs by one between mutually adjacent lines.

11. The method of claim 10, wherein:

the area piece has a first edge defined by a first edge of a first line of rectangles, the first line containing a minimum number of rectangles;
at least three further lines are adjacent to the first line, the at least three further lines respectively containing a number of rectangles which increases from line to line until at least a central line of the area piece contains a maximum number of rectangles; and
at least three further lines are adjacent to the at least one central line, the at least three further lines respectively containing a number of rectangles which decreases from line to line until a last line of the area piece contains the minimum number of rectangles.

12. The method of claim 9, wherein the area piece has at least one group made of more than four lines in which the number of rectangles per line differs by one between mutually adjacent lines.

13. The method of claim 12, wherein:

the area piece has a first edge defined by a first edge of a first line of rectangles, the first line containing a minimum number of rectangles;

at least three further lines are adjacent to the first line, the at least three further lines respectively containing a number of rectangles which increases from line to line until at least a central line of the area piece contains a maximum number of rectangles; and at least three further lines are adjacent to the at least one central line, the at least three further lines respectively containing a number of rectangles which decreases from line to line until a last line of the area piece contains the minimum number of rectangles.

14. The method of claim 9, wherein:

the area piece has a first edge defined by a first edge of a first line of rectangles, the first line containing a minimum number of rectangles;

at least three further lines are adjacent to the first line, the at least three further lines respectively containing a number of rectangles which increases from line to line until at least a central line of the area piece contains a maximum number of rectangles; and at least three further lines are adjacent to the at least one central line, the at least three further lines respectively containing a number of rectangles which decreases from line to line until a last line of the area piece contains the minimum number of rectangles.

15. The method of claim 14, wherein:

a first, a second, a third and a fourth line are arranged directly next to one another in this sequence in the group;

the center points of a plurality of rectangles of the first line are arranged in each case together with a center point of a rectangle from the third line on second straight lines which extend orthogonal to the first straight lines;

the center points of a plurality of rectangles of the second line are arranged in each case together with a center point of a rectangle from the fourth line on third straight lines which extend orthogonal to the first straight lines; and a plurality of the second straight lines are respectively arranged centrally between two directly adjacent third straight lines.

16. The method of claim 15, wherein each part of the area piece corresponding to one of the rectangles is scanned by a single beam of the multi-beam particle microscope when recording the particle-microscopic image of the area piece.

17. The method of claim 16, wherein the number of rectangles in the area piece is $3n(n-1)+1$.

18. The method of claim 9, wherein:

a first, a second, a third and a fourth line are arranged directly next to one another in this sequence in the group;

the center points of a plurality of rectangles of the first line are arranged in each case together with a center point of a rectangle from the third line on second straight lines which extend orthogonal to the first straight lines;

the center points of a plurality of rectangles of the second line are arranged in each case together with a center point of a rectangle from the fourth line on third straight lines which extend orthogonal to the first straight lines; and a plurality of the second straight lines are respectively arranged centrally between two directly adjacent third straight lines.

19. The method of claim 9, wherein each part of the area piece corresponding to one of the rectangles is scanned by a single beam of the multi-beam particle microscope when recording the particle-microscopic image of the area piece.

20. The method of claim 9, wherein the number of rectangles in the area piece is $3n(n-1)+1$.

* * * * *

UNITED STATES PATENT AND TRADEMARK OFFICE
CERTIFICATE OF CORRECTION

PATENT NO. : 9,536,702 B2
APPLICATION NO. : 14/724541
DATED : January 3, 2017
INVENTOR(S) : Uwe Lang et al.

It is certified that error appears in the above-identified patent and that said Letters Patent is hereby corrected as shown below:

On the Title Page

Page 2, Column 2, Line 6, item (56), under "OTHER PUBLICATIONS", delete "nanopattering" and insert -- nanopatterning --.

Signed and Sealed this
Twenty-third Day of May, 2017

Michelle K. Lee
*Director of the United States Patent and Trademark Office*